(12) United States Patent
Dai

(10) Patent No.: US 9,520,488 B2
(45) Date of Patent: Dec. 13, 2016

(54) SILICON-CONTROLLED RECTIFIER ELECTROSTATIC DISCHARGE PROTECTION DEVICE AND METHOD FOR FORMING THE SAME

(71) Applicant: Semiconductor Manufacturing International (Shanghai) Corporation, Shanghai (CN)

(72) Inventor: Meng Dai, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 121 days.

(21) Appl. No.: 14/332,534

(22) Filed: Jul. 16, 2014

(65) Prior Publication Data

US 2015/0187749 A1    Jul. 2, 2015

(30) Foreign Application Priority Data

Dec. 30, 2013    (CN) .......................... 2013 1 0745752

(51) Int. Cl.
| | |
|---|---|
| *H01L 27/02* | (2006.01) |
| *H01L 29/74* | (2006.01) |
| *H01L 29/66* | (2006.01) |
| *H01L 29/87* | (2006.01) |
| *H01L 29/06* | (2006.01) |

(52) U.S. Cl.
CPC ....... *H01L 29/7436* (2013.01); *H01L 27/0262* (2013.01); *H01L 29/66121* (2013.01); *H01L 29/87* (2013.01); *H01L 29/0626* (2013.01); *H01L 29/0649* (2013.01)

(58) Field of Classification Search
CPC ............. H01L 29/7436; H01L 29/7432; H01L 2924/13034; H01L 2924/13035; H01L 27/0262; H01L 27/0817; H01L 27/0921; H01L 27/1027
See application file for complete search history.

(56) References Cited

U.S. PATENT DOCUMENTS

| | | | | |
|---|---|---|---|---|
| 2008/0253046 | A1* | 10/2008 | Lou ..................... | H01L 27/0262 361/56 |
| 2012/0199874 | A1* | 8/2012 | Salcedo ............. | H01L 27/0262 257/120 |
| 2013/0341676 | A1* | 12/2013 | Lee ........................ | H01L 29/73 257/148 |

\* cited by examiner

*Primary Examiner* — Benjamin Sandvik
*Assistant Examiner* — Leslie Pilar Cruz
(74) *Attorney, Agent, or Firm* — Anova Law Group, PLLC

(57) ABSTRACT

Various embodiments provide SCR ESD protection devices and methods for forming the same. An exemplary device includes a semiconductor substrate having a P-type well region, an N-type well region adjacent to the P-type well region, a first P-type doped region and a first N-type doped region in the P-type well region, and a second N-type doped region and a second P-type doped region in the N-type well region. A first center-doped region and a second center-doped region doped with impurity ions of a same type are located between the first N-type doped region and the second P-type doped region and extend across the P-type well region and the N-type well region. The first center-doped region is located within the second center-doped region, has a doping concentration higher than a doping concentration in the second center-doped region, and has a depth smaller than a depth of the second center-doped region.

20 Claims, 5 Drawing Sheets

SILICON-CONTROLLED RECTIFIER ELECTROSTATIC DISCHARGE PROTECTION DEVICE AND METHOD FOR FORMING THE SAME

CROSS-REFERENCES TO RELATED APPLICATIONS

This application claims priority to Chinese Patent Application No. CN201310745752.6, filed on Dec. 30, 2013, the entire content of which is incorporated herein by reference.

FIELD OF THE DISCLOSURE

The present disclosure relates to the field of integrated circuit (IC) electrostatic discharge protection circuit design and, more particularly, relates to silicon-controlled rectifier (SCR) electrostatic discharge (ESD) protection devices and methods for forming the same.

BACKGROUND

In fabrication and application of IC chips, with continuous improvement of very-large-scale integration (VLSI) process technology, current complementary metal-oxide-semiconductor (CMOS) IC fabrication technology has entered deep sub-micron stage. Size of metal-oxide-semiconductor (MOS) devices shrinks continuously. Thickness of gate oxide layer is continuously reduced. Voltage tolerance of MOS devices is significantly decreased. The harm of electrostatic discharge (ESD) to IC has become more and more significant. Therefore, ESD protection for IC becomes particularly important.

In order to improve ESD protection, input and output interface terminal (I/O pad) of a chip is often connected to an ESD protection circuit. The ESD protection circuit is configured to provide the internal circuit of the chip with a discharge path for ESD current, in order to prevent ESD from breaking down the internal circuit.

Silicon-controlled rectifier (SCR), also referred to as thyristor, is often used in ESD protection device. Under a normal condition, there is no conduction between the cathode and the anode of a thyristor. A positive trigger pulse needs to be applied to a control electrode to turn on the conduction between the cathode and the anode of the thyristor. Once the conduction of the thyristor is turned on and a stable current is formed, even if the externally voltage applied to the control electrode is removed, the conduction of the thyristor can remain on, until the current between the cathode and the anode is smaller than a minimum current for maintaining the conduction (i.e., a holding current) when the thyristor is turned off by itself.

FIG. 1 depicts a schematic circuit diagram of a conventional ESD protection circuit. As shown in FIG. 1, a to-be-protected device 4 releases its electrostatic charge via an electrostatic-discharging terminal 3. A first thyristor 1 and a second thyristor 2 can respectively use a bidirectional thyristor having the same specification. The first thyristor 1 has an anode connected to a high-voltage source line Vdd, and a cathode connected to the electrostatic-discharging terminal 3. The second thyristor 2 has an anode connected to the electrostatic-discharging terminal 3, and a cathode connected to a low-voltage source line Vss. Thus, regardless of the electric potential of the electrostatic-discharging terminal 3, electrostatic charge can be released toward the high-voltage source line Vdd or the low-voltage source line Vss via the first thyristor 1 and the second thyristor 2.

The anode and the cathode of the first thyristor 1 and the second thyristor 2 merely represent the input and output electrodes of the thyristors, and do not limit the direction of current flow in the thyristors. In addition, during a normal operation of the circuit, the low-voltage source line Vss is usually connected to a ground potential (i.e., is usually grounded), in order to fix the electric potential.

Still referring to FIG. 1, according to different directions of the current flow from the electrostatic-discharging terminal 3 at different electric potentials to the high-voltage source line Vdd and the low-voltage source line Vss during an ESD, four operating modes of the bidirectional thyristors can be defined. That is, the first thyristor 1 works in a negative-to-Vdd (ND) mode or a positive-to-Vdd (PD) mode, while the second thyristor 2 works in a positive-to-Vss (PS) mode or a negative-to-Vss (NS) mode.

FIG. 2 depicts a cross-sectional view of a conventional SCR ESD protection device. As shown in FIG. 2, the device includes a P-type substrate 100, an N-well 101 and a P-well 102 that are in the P-type substrate 100 and are adjacent, a first N+ type implanted region 201 and a first P+ type implanted region 202 located at the surface of the N-well 101, a second N+ type implanted region 204 and a second P+ type implanted region 205 at the surface the P-well 102, and an N+ type connection region 203 that extends across the surface of the N-well 101 and the P-well 102. The various implanted regions described above and the connection region 203 are isolated from each other by shallow trench isolation (STI) structures 109. The first N+ type implanted region 201 and the first P+ type implanted region 202 are connected with each other, to be used as the anode of a thyristor. The second N+ type implanted region 204 is used as the cathode of the thyristor. The second P+ type implanted region 205 is grounded. When being used in an ESD protection circuit as shown in FIG. 1, the second P+ type implanted region 205 can be connected to the low-voltage source line Vss. Although the N+ type connection region 203 is depicted as a region in FIG. 2, the N+ type connection region 203 is merely a surface layer formed via an implantation process that is limited to the surface of the thyristor, i.e., limited to the surface of the N-well 101 and the P-well 102.

FIG. 3 depicts an equivalent circuit diagram of a conventional SCR ESD protection device as shown in FIG. 2. Combing FIG. 3 with FIG. 2, the N-well 101, the P-well 102 and the second N+ type implanted region 204 form an NPN-type transistor T2. According to the difference in implantation concentration, a PN junction formed by the P-well 102 and the second N+ type implanted region 204 is an emitter. Similarly, the first P+ type implanted region 202, the N-well 101, and the P-well 102 form a PNP-type transistor T1. According to the difference in implantation concentration, a PN junction formed by the first P+ type implanted region 202 and the N-well 101 is an emitter.

Because adjacent regions having the same doping type can be considered as electrically connected regions, an equivalent circuit of the thyristor can be connected as follows. The emitter of the NPN-type transistor T2 is connected to the cathode of the thyristor. The base of the NPN-type transistor T2 is connected to the collector of the PNP transistor T1. The collector of the NPN-type transistor T2 is connected to the anode of the thyristor via an equivalent resistance Rnwell of the N-well 101. Meanwhile, the base of the PNP transistor T1 is connected to the collector of the NPN-type transistor T2. The emitter of the PNP transistor T1 is connected to the anode of the thyristor. The collector of the PNP transistor T1 is connected to the ground potential via an equivalent resistance Rpwell of the P-well 102. The NPN-type transistor T2 and the PNP-type transistor T1 form a typical thyristor structure. When a forward bias voltage is externally applied between the anode and the cathode and exceeds a trigger value, the bias voltage needs to form a reverse breakdown current between the N-well 101 and the P-well 102 in order to form a stable current in the thyristor without the need of additionally configuring a control electrode.

However, the performance of the existing SCR ESD protection device is still to be improved. The disclosed methods and structures are directed to solve one or more problems set forth above and other problems.

BRIEF SUMMARY OF THE DISCLOSURE

One aspect of the present disclosure includes silicon-controlled rectifier (SCR) electrostatic discharge protection (ESD) devices. An exemplary device can include a semiconductor substrate having a P-type well region and an N-type well region adjacent to the P-type well region. The device can include a first P-type doped region in the P-type well region, and a first N-type doped region in the P-type well region between the first P-type doped region and the N-type well region. The device can include a second N-type doped region in the N-type well region, and a second P-type doped region in the N-type well region between the second N-type doped region and the P-type well region. The device can further include a first center-doped region and a second center-doped region. The first center-doped region and the second center-doped region can be located between the first N-type doped region and the second P-type doped region and extend across the P-type well region and the N-type well region. The first center-doped region can be located within the second center-doped region. The second center-doped region can have a depth greater than a depth of the first center-doped region. The first center-doped region and the second center-doped region can be doped with impurity ions of a same type. A concentration of the impurity ions (i.e., doping concentration) in the first center-doped region can be higher than a concentration of the impurity ions in the second center-doped region.

Another aspect of the present disclosure includes methods for forming an SCR ESD device. In an exemplary method, a semiconductor substrate can be provided. A P-type well region and an N-type well region adjacent to the P-type well region can be formed in the semiconductor substrate. A second center-doped region that extends across the P-type well region and the N-type well region can be formed. A first center-doped region can be formed in the second center-doped region. A depth of the second center-doped region can be greater than a depth of the first center-doped region. The first center-doped region and the second center-doped region can be doped with impurity ions of a same type. A concentration of the impurity ions in the first center-doped region can be higher than a concentration of the impurity ions in the second center-doped region. A first P-type doped region can be formed in the P-type well region at a first side of the second center-doped region. A first N-type doped region can be formed in the P-type well region at the first side of the second center-doped region. The first N-type doped region can be located between the first P-type doped region and the second center-doped region. A second N-type doped region can be formed in the N-type well region at a second side of the second center-doped region. A second P-type doped region can be formed in the N-type well region at the second side of the second center-doped region. The second P-type doped region can be located between the second N-type doped region and the second center-doped region.

Other aspects or embodiments of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
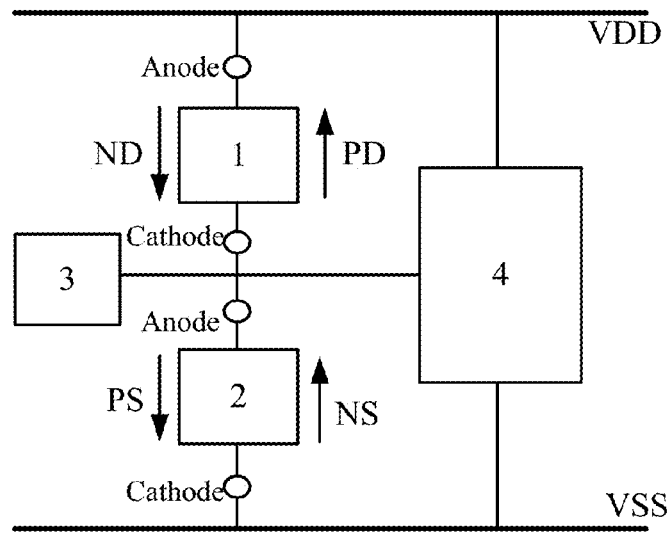
FIG. 1 depicts a schematic circuit diagram of a conventional ESD protection circuit.
Figure 2:
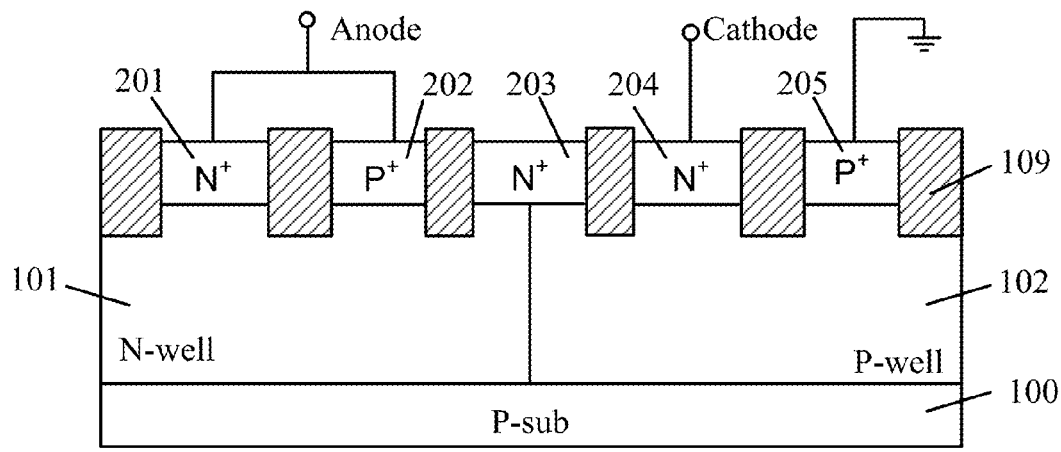
FIG. 2 depicts a cross-sectional view of a conventional SCR ESD protection device.
Figure 3:
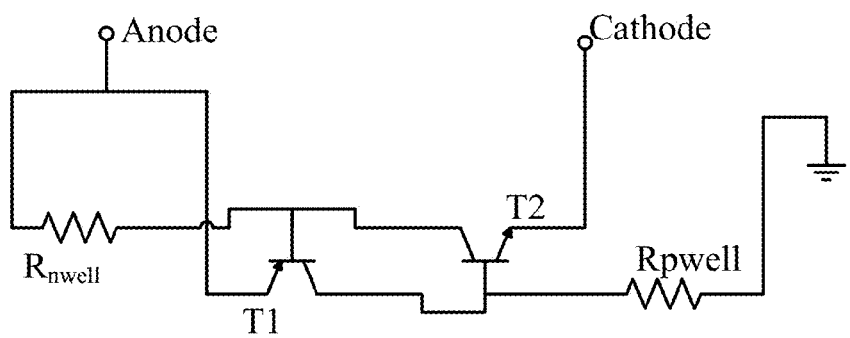
FIG. 3 depicts an equivalent circuit diagram of a conventional SCR ESD protection device.

The trigger voltage of a conventional SCR ESD protection device (as shown in FIG. 2) is too high and the holding voltage is too low, which can easily cause a latch-up effect and is not beneficial for improving performance of the SCR ESD protection device. Various embodiments provide an SCR ESD protection device that can reduce the trigger voltage and increase the holding voltage.

Figure 4:
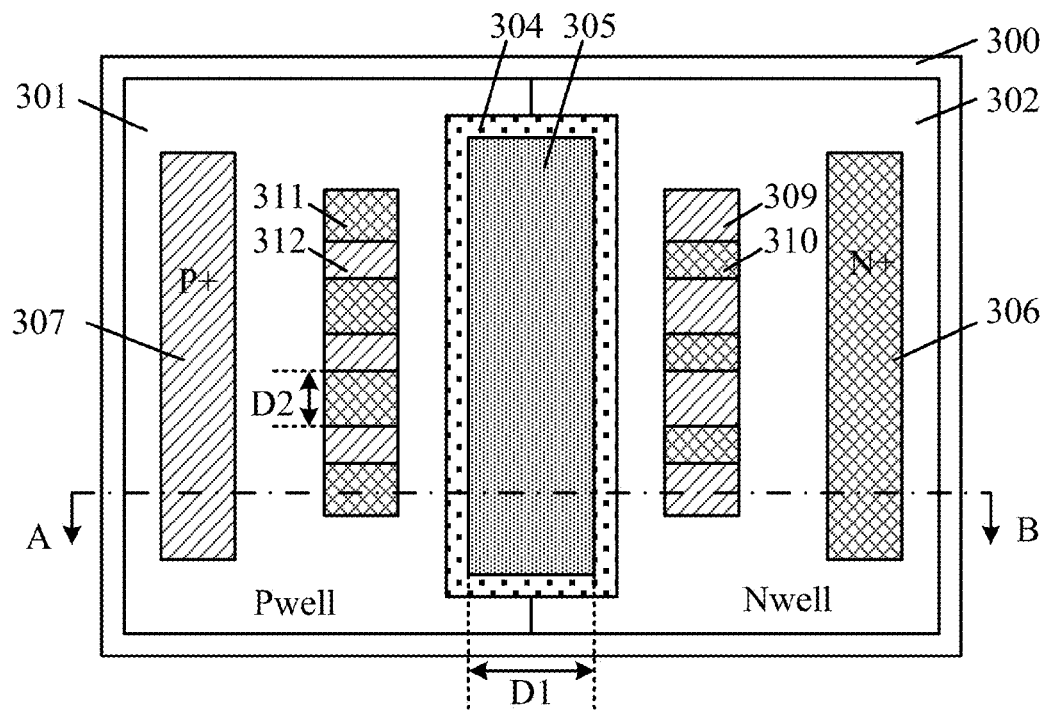
FIGS. 4-5 depict structures of an exemplary SCR ESD protection device in accordance with various disclosed embodiments.
Figure 5:
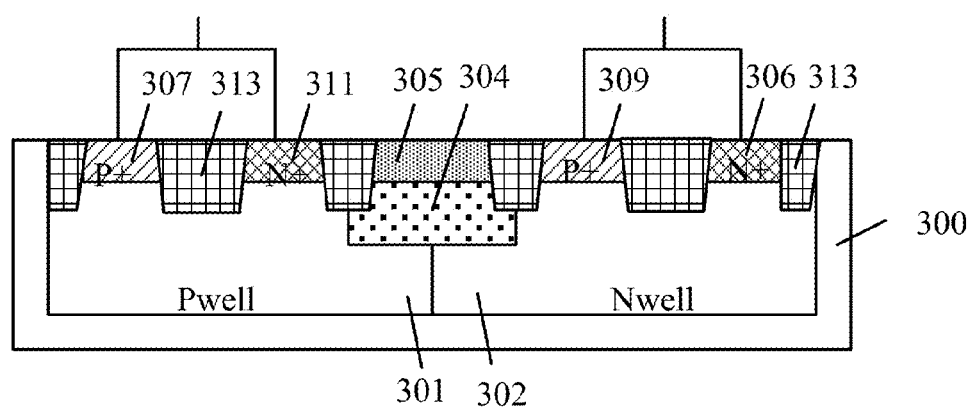

FIG. 4 depicts a top-view structure diagram of an exemplary SCR ESD protection device in accordance with various disclosed embodiments. FIG. 5 depicts a cross-sectional view of the device along a direction of a cutting line AB as shown in FIG. 4.

Referring to FIGS. 4-5, the SCR ESD protection device can include a semiconductor substrate 300. A P-type well region 301 and an N-type well region 302 adjacent to the P-type well region 301 can be formed in the semiconductor substrate 300.

The device can further include a first P-type doped region 307 in the P-type well region 301, and a first N-type doped region 311 located within the P-type well region 301 between the first P-type doped region 307 and the N-type well region 302. The device can further include a second N-type doped region 306, and a second P-type doped region 309 located within the N-type well region 302 between the second N-type doped region 306 and the P-type well region 301.

The device can further include a first doped region 305 and a second doped region 304. The first doped region 305 and the second doped region 304 can be located between the first N-type doped region 311 and the second P-type doped region 309, and can extend across the P-type well region 301 and the N-type well region 302.

As used herein, unless otherwise specified, the 'first doped region 305' can also be referred to as the 'first center-doped region 305', or the 'inner center-doped region 305', or the 'upper center-doped region 305'. The 'second doped region 304' can also be referred to as the 'second center-doped region 304', or the 'outer center-doped region 304', or the 'lower center-doped region 304'.

The first center-doped region 305 can be located within the second center-doped region 304. The second center-doped region 304 can have a depth greater than the depth of the first center-doped region 305. Impurity ions doped in the first center-doped region 305 and the second center-doped region 304 can be of the same type. The concentration of the impurity ions in the first center-doped region 305 can be higher than the concentration of the impurity ions in the second center-doped region 304.

In one embodiment, the impurity ions doped in the first center-doped region 305 and the second center-doped region 304 can be N-type. The N-type impurity ions can include phosphorus ions, arsenic ions, antimony ions, or a combination thereof. The depth of the second center-doped region 304 can be smaller than the depth of the N-type well region 302. The concentration of the impurity ions in the second center-doped region 304 can be higher than the concentration of the impurity ions in the N-type well region 302. The concentration of the impurity ions in the second center-doped region 304 can be lower than the concentration of the impurity ions in the first center-doped region 305.

The first N-type doped region 311, the P-type well region 301, and the second center-doped region 304 (and the first center-doped region 305 and the N-type well region 302) can form a parasitic NPN transistor. The first N-type doped region 311 can form an emitter region of the parasitic NPN transistor. The P-type well region 301 can form a base region of the parasitic NPN transistor. The second center-doped region 304 (and the first center-doped region 305 and the N-type well region 302) can form the collector region of the parasitic NPN transistor.

As used herein, unless otherwise specified, 'emitter region' can be used interchangeably with 'emitter', 'base region' can be used interchangeably with 'base', and 'collector region' can be used interchangeably with 'collector'.

The second P-type doped region 309, the N-type well region 302 (and the second center-doped region 304 and the first center-doped region 305), and the P-type well region 301 can form a parasitic PNP transistor. The second P-type doped region 309 can form an emitter region of the parasitic PNP transistor. The N-type well region 302 (and the second center-doped region 304 and the first center-doped region 305) can form a base region of the parasitic PNP transistor. The P-type well region 301 can form the collector region of the parasitic PNP transistor.

When accumulation of electrostatic charge occurs, the SCR ESD protection device can be triggered by reverse breakdown of the junction of the wells to generate a trigger current. In one embodiment, the concentration of impurity ions in the N-type well region 302, the second center-doped region 304 and the first center-doped region 305 can progressively increase from the bottom of the semiconductor substrate 300 to the surface of the semiconductor substrate 300. By adding the second center-doped region 304 the first center-doped region 305 that have a relatively high doping concentration, the junction of the SCR ESD protection device that is reversely broken down can be the PN junction formed by the P-type well region 301 and the second center-doped region 304. Thus, compared with the trigger voltage for the breakdown of the PN junction formed by a PN junction formed by the P-type well region 301 and the N-type well region 302, the trigger voltage can be reduced.

When the accumulation of electrostatic charge causes the reverse breakdown of the PN junction formed by the P-type well region 301 and the second center-doped region 304, the breakdown current can be concentrated at a location where the parasitic resistance is relatively low, i.e., at the interface where the second center-doped region 304 and the first center-doped region 305 contact the P-type well region 301. The voltage drop caused by the breakdown current can turn on the parasitic NPN transistor. After the parasitic NPN transistor is turned on, the parasitic PNP transistor can be turned on. After being turned on, the parasitic NPN transistor and the parasitic PNP transistor can enter a linear operation region or a linear amplification region. From the operating principles of a transistor, it can be known that, at that time, the current can choose to flow via a path having a relatively low doping concentration in the base region (i.e., the N-type well region 302 and the P-type well region 301). With the increasing of the current, due to the influence of a high injection effect (because the doping concentration of the second P-type doped region 309 is relatively high), the current amplification (or current gain) of the parasitic PNP transistor can be reduced. The current can start to move toward the base region of the parasitic PNP transistor (i.e., the second center-doped region 304 and the first center-doped region 305), which has a relatively high doping concentration. At this time, the second center-doped region 304 and the first center-doped region 305 region can also be involved in discharging or releasing the current.

Therefore, using the SCR ESD protection device according to various disclosed embodiments, when an electrostatic current is released, with the increase of the current, the paths for releasing the electrostatic current can be increased. The electrostatic current can have a more uniform distribution. Thus, the current gain of the parasitic PNP transistor can be reduced. Accordingly, the holding voltage during electrostatic discharge can be increased, and latch-up effect can be effectively prevented. As used herein, 'electrostatic current' can be used interchangeably with 'electrostatic discharge current' or 'ESD current'.

In order to, at the same time of reducing the trigger voltage and increasing the holding voltage of the SCR ESD protection device, make the distribution of the current more uniform when the SCR ESD protection device releases the electrostatic current and, the width D1 of the first center-doped region 305 can range from about 3 microns to about 20 microns. When the impurity ions doped in the first center-doped region 305 and the second center-doped region 304 are N-type, the concentration of the impurity ions in the N-type well region 302 can be less than about 1E18 atom/$cm^3$, the concentration of the impurity ions in the second center-doped region 304 can range from about 1E18 atom/$cm^3$ to about 1E19 atom/$cm^3$, and the concentration of the impurity ions in the first center-doped region 305 can be higher than about 1E19 atom/$cm^3$.

Referring to FIG. 4, the first N-type doped region 311 can have a plurality of discrete third P-type doped regions 312 therein. The plurality of third P-type doped regions 312 can divide the first N-type doped region 311 into a plurality of first N-type sub-doped regions. The plurality of first N-type sub-doped regions can have an equal area. The depth of the third P-type doped regions 312 can be equal to or greater than the depth of the first N-type doped region 311. The width of the third P-type doped regions 312 can be equal to or greater than the width of the first N-type doped region 311, where the width refers to the size of the third P-type doped regions 312 or the first N-type doped region 311 in the direction of the cutting line AB.

The length D2 of each of the first N-type sub-doped regions can range from about 0.5 micron to about 5 microns. By using the third P-type doped regions 312, the area of the first N-type doped region 311 can be reduced. That is, the area of the emitter of the parasitic NPN transistor can be reduced, and emitter efficiency can be reduced. Thus, the current gain of the parasitic NPN transistor can be reduced. Accordingly, the holding voltage of the SCR ESD protection device can be increased.

The second P-type doped region 309 can have a plurality of discrete third N-type doped regions 310 therein. The plurality of third N-type doped regions 310 can divide the second P-type doped region 309 into a plurality of second P-type sub-doped regions. The plurality of second P-type sub-doped regions can have an equal area. The depth of the third N-type doped regions 310 can be equal to or greater than the depth of the second P-type doped region 309. The width of the third N-type doped regions 310 can be equal to or greater than the width of the second P-type doped region 309, where the width refers to the size of the third N-type doped regions 310 or the second P-type doped region 309 in the direction of the cutting line AB.

The length D2 of each of the second P-type sub-doped regions can range from about 0.5 micron to about 5 microns. By using the third N-type doped regions 310, the area of the second P-type doped region 309 can be reduced. That is, the area of the emitter of the parasitic PNP transistor can be reduced, and emitter efficiency can be reduced. Thus, the current gain of the parasitic PNP transistor can be reduced. Accordingly, the holding voltage of the SCR ESD protection device can be increased.

In another embodiment, the concentration of the N-type impurity ions in the second center-doped region 304 can be gradually increased from the lower surface of the second center-doped region 304 to the upper surface of the second center-doped region 304, in the direction from the bottom of the semiconductor substrate 300 to the surface of the semiconductor substrate 300. The concentration of the N-type impurity ions at the lower surface of the second center-doped region 304 can be higher than the concentration of the N-type impurity ions in the N-type well region 302. The concentration of the N-type impurity ions at the upper surface of the second center-doped region 304 can be lower than the concentration of the N-type impurity ions in the first center-doped region 305. With the increase of the electrostatic discharge current, the path(s) for electrostatic discharge can be gradually increased. The distribution of the ESD current can be more uniform. The concentration of the N-type impurity ions in the second center-doped region 304 can be increased in various manners, e.g., in a stepwise manner, in a linear manner, or the like.

Referring to FIG. 5, an STI structure 313 can be formed between the adjacent doped regions. The STI structure 313 can be made of a material including silicon oxide, and/or the like. In various embodiments, 'between the adjacent doped regions' can refer to any one or more of 'between the first P-type doped region 307 and the first N-type doped region 311', 'between the first N-type doped region 311 and one or both of the first center-doped region 305 and the second center-doped region 304', 'between one or both of the first center-doped region 305 and the second center-doped region 304 and the second P-type doped region 309', and 'between the second P-type doped region 309 and the second N-type doped region 306'.

Further, in one embodiment, the depth of the first center-doped region 305 can be smaller than the depth of the STI structure 313, and the depth of the second center-doped region 304 can be greater than the depth of the STI structure 313, as shown in FIG. 5. The depth of the first center-doped region 305 can be similar to or smaller than the depth of the first P-type doped region 307, the first N-type doped region 311, the second P-type doped region 309, and the second N-type doped region 306. The depth of the second center-doped region 304 can be greater than the depth of the first P-type doped region 307, the first N-type doped region 311, the second P-type doped region 309, and the second N-type doped region 306, such that the electrostatic current can more easily move toward the second center-doped region 304 from the N-type well region 302 and the P-type well region 301, when the electrostatic current is increased.

In addition, in one embodiment, the length of the second center-doped region 304 can be greater than the length of the first center-doped region 305, and the width of the second center-doped region 304 can be greater than the width of the first center-doped region 305, as shown in FIG. 4, where the width refers to the size in the direction of the cutting line AB, and the length refers to the size in the direction vertical to the cutting line AB.

In another embodiment, the impurity ions doped in the first center-doped region 305 and the second center-doped region 304 can be P-type. The P-type impurity ions can include boron ions, gallium ions, indium ions, or a combination thereof. The depth of the second center-doped region 304 can be smaller than the depth of the p-type well region 301. The concentration of the impurity ions in the second center-doped region 304 can be higher than the concentration of the P-type impurity ions in the p-type well region 301. The concentration of the P-type impurity ions in the second center-doped region 304 can be lower than the concentration of the P-type impurity ions in the first center-doped region 305.

The first N-type doped region 311, the P-type well region 301 (and the second center-doped region 304 and the first center-doped region 305), and the N-type well region 302 can form a parasitic NPN transistor. The first N-type doped region 311 can form an emitter region of the parasitic NPN transistor. The P-type well region 301 (and the second center-doped region 304 and the first center-doped region 305) can form a base region of the parasitic NPN transistor. The N-type well region 302 can form the collector region of the parasitic NPN transistor.

The second P-type doped region 309, the N-type well region 302, and the P-type well region 301 (and the second center-doped region 304 and the first center-doped region 305), can form a parasitic PNP transistor. The second P-type doped region 309 can form an emitter region of the parasitic PNP transistor. The N-type well region 302 can form a base region of the parasitic PNP transistor. The P-type well region 301 (and the second center-doped region 304 and the first center-doped region 305) can form the collector region of the parasitic PNP transistor.

When accumulation of electrostatic charge occurs, the junction of the SCR ESD protection device that is reversely broken down can be the PN junction formed by the N-type well region 302 and the second center-doped region 304. By using the second center-doped region 304 that has a relatively high concentration of doped ions, the trigger voltage can be reduced, compared with the trigger voltage for the breakdown of the PN junction formed by a PN junction formed by the P-type well region 301 and the N-type well region 302.

When the accumulation of electrostatic charge causes the reverse breakdown of the PN junction formed by the N-type well region 302 and the second center-doped region 304, the breakdown current can be concentrated at a location where the parasitic resistance is relatively low, i.e., the interface where the second center-doped region 304 and the first center-doped region 305 contact the N-type well region 302. The voltage drop caused by the breakdown current can turn on the parasitic PNP transistor. After the parasitic PNP transistor is turned on, the parasitic NPN transistor can be turned on. After being turned on, the parasitic PNP transistor and the parasitic NPN transistor can enter a linear operation region or a linear amplification region. According to the operating principles of a transistor, it can be known that, at that time, the current can choose to flow via a path having a relatively low doping concentration in the base region (i.e., the N-type well region 302 and the P-type well region 301). With the increase of the current, due to the influence of a high injection effect (because the doping concentration of the first N-type doped region 311 is relatively high), the current gain of the parasitic NPN transistor can be reduced. The current can start to move toward the base region of the parasitic NPN transistor (i.e., the second center-doped region 304 and the first center-doped region 305), which has a relatively high doping concentration. At this time, the second center-doped region 304 and the first center-doped region 305 can also be involved in discharging or releasing the current.

Therefore, using the SCR ESD protection device according to various disclosed embodiments, when an electrostatic current is released, with the increase of the current, the paths for releasing the electrostatic current can be increased. The electrostatic current can have a more uniform distribution. Thus, the current gain of the parasitic NPN transistor can be reduced. Accordingly, the holding voltage during electrostatic discharge can be increased, and latch-up effect can be effectively prevented.

In order to make the distribution of the current more uniform when the SCR ESD protection device releases the electrostatic current and at the same time of reducing the trigger voltage and increasing the holding voltage of the SCR ESD protection device, the width D1 of the first center-doped region 305 can range from about 3 microns to about 20 microns. When the impurity ions doped in the first center-doped region 305 and the second center-doped region 304 are P-type, the concentration of the impurity ions in the P-type well region 301 can be less than about 1E18 atom/cm$^3$, the concentration of the impurity ions in the second center-doped region 304 can range from about 1E18 atom/cm$^3$ to about 1E19 atom/cm$^3$, and the concentration of the impurity ions in the first center-doped region 305 can be higher than about 1E19 atom/cm$^3$.

In another embodiment, the concentration of the P-type impurity ions in the second center-doped region 304 can be gradually increased from the lower surface of the second center-doped region 304 to the upper surface of the second center-doped region 304, in the direction from the bottom of the semiconductor substrate 300 to the surface of the semiconductor substrate 300. The concentration of the P-type impurity ions at the lower surface of the second center-doped region 304 can be higher than the concentration of the P-type impurity ions in the P-type well region 301. The concentration of the P-type impurity ions at the upper surface of the second center-doped region 304 can be lower than the concentration of the P-type impurity ions in the first center-doped region 305. With the increase of the electrostatic discharge current, the path(s) for electrostatic discharge can be gradually increased. The distribution of the ESD current can be more uniform. The concentration of the P-type impurity ions in the second center-doped region 304 can be increased in various manners, e.g., increased in a stepwise manner, increased in a linear manner, or the like.

Figure 6:
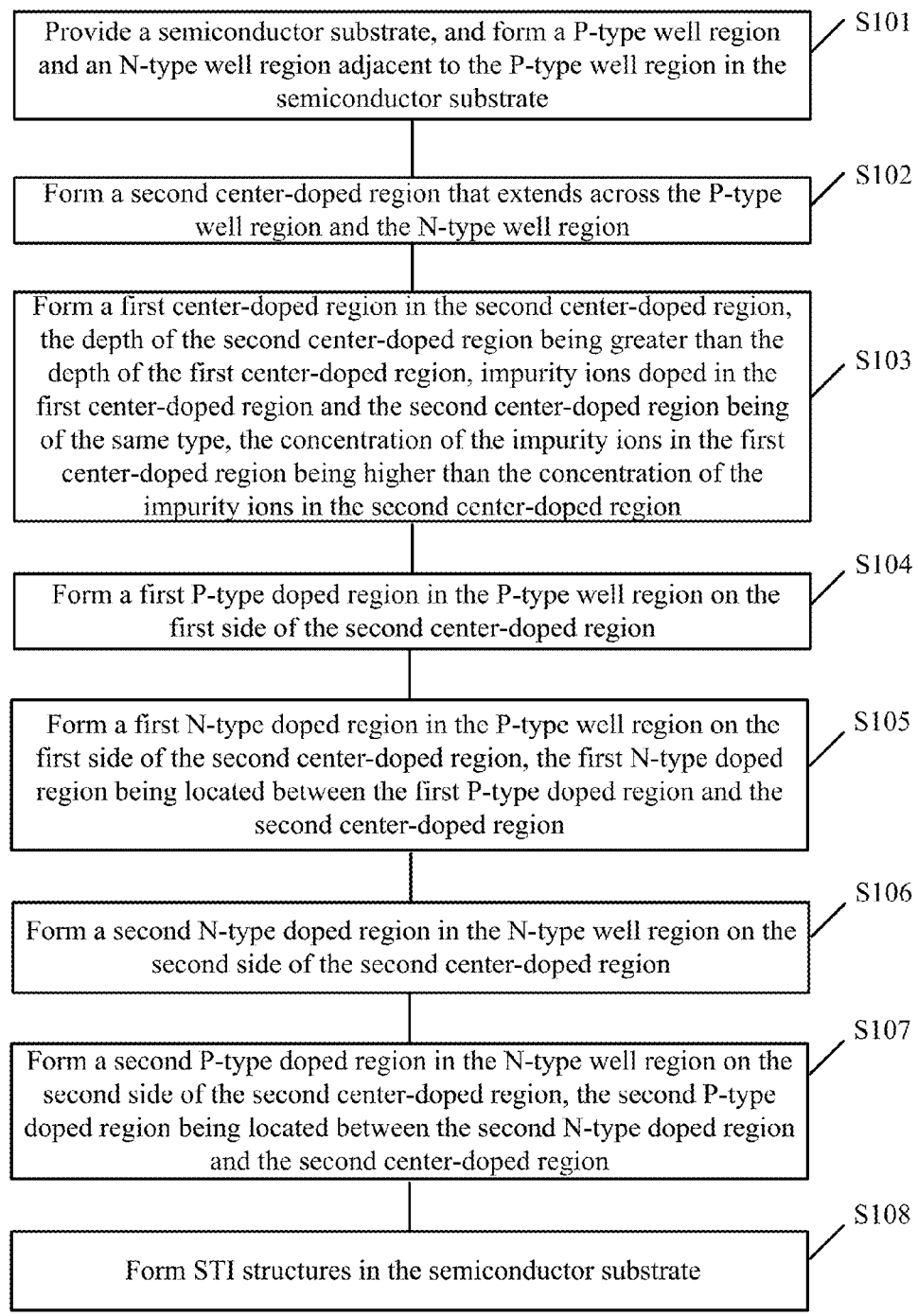
FIG. 6 depicts a flow diagram of an exemplary method for forming an SCR ESD protection device in accordance with various disclosed embodiments.

Various embodiments also provide methods for forming the above-described SCR ESD protection device. FIG. 6 depicts a flow diagram of an exemplary method for forming an SCR ESD protection device in accordance with various disclosed embodiments. For illustrative purposes, FIG. 5 depicts a cross-sectional view of an exemplary SCR ESD protection device that can be formed using the method described in FIG. 6. Note that although FIG. 5 depicts a semiconductor structure corresponding to the method depicted in FIG. 6, the semiconductor structure and the method are not limited to one another in any manner.

As shown in FIG. 6, an exemplary method can include the following process using structures illustrated in FIGS. 4-5 as examples. In Step S101, a semiconductor substrate 300 is provided. A P-type well region 301 and an N-type well region 302 adjacent to the P-type well region 301 are formed in the semiconductor substrate 300.

In Step S102, a second center-doped region 304 that extends across the P-type well region 301 and the N-type well region 302 is formed. The second center-doped region 304 can have two sides, which can be referred to as a first side, and a second side opposite to the first side along the direction of the cutting line AB as shown in FIG. 4.

In Step S103, a first center-doped region 305 can be formed in the second center-doped region 304. The depth of the second center-doped region 304 can be greater than the depth of the first center-doped region 305. Impurity ions doped in the first center-doped region 305 and the second center-doped region 304 can be of the same type. The concentration of the impurity ions in the first center-doped region 305 can be higher than the concentration of the impurity ions in the second center-doped region 304.

In Step S104, a first P-type doped region 307 is formed in the P-type well region 301 on the first side of the second center-doped region 304. In Step S105, a first N-type doped region 311 is formed in the P-type well region 301 on the first side of the second center-doped region 304. The first N-type doped region 311 can be located between the first P-type doped region 307 and the second center-doped region 304.

In Step S106, a second N-type doped region 306 is formed in the N-type well region 302 on the second side of the second center-doped region 304. In Step S107, a second P-type doped region 309 is formed in the N-type well region 302 on the second side of the second center-doped region 304. The second P-type doped region 309 can be located between the second N-type doped region 306 and the second center-doped region 304.

In one embodiment, the impurity ions doped in the first center-doped region 305 and the second center-doped region 304 can be N-type. The depth of the second center-doped region 304 can be smaller than the depth of the N-type well region 302. The concentration of the impurity ions in the second center-doped region 304 can be higher than the concentration of the N-type impurity ions in the N-type well region 302.

The concentration of the impurity ions in the N-type well region 302 can be less than about 1E18 atom/cm$^3$. The concentration of the impurity ions in the second center-doped region 304 can range from about 1E18 atom/cm$^3$ to about 1E19 atom/cm$^3$. The concentration of the impurity ions in the first center-doped region 305 can be higher than about 1E19 atom/cm$^3$.

In another embodiment, the impurity ions doped in the first center-doped region 305 and the second center-doped region 304 can be P-type. The depth of the second center-doped region 304 can be smaller than the depth of the p-type well region 301. The concentration of the impurity ions in the second center-doped region 304 can be higher than the concentration of the P-type impurity ions in the p-type well region 301.

The concentration of the impurity ions in the P-type well region 301 can be less than about 1E18 atom/cm$^3$. The concentration of the impurity ions in the second center-doped region 304 can range from about 1E18 atom/cm$^3$ to about 1E19 atom/cm$^3$. The concentration of the impurity ions in the first center-doped region 305 can be higher than about 1E19 atom/cm$^3$.

In Step S108 of FIG. 6 and referring to FIG. 4, after the P-type well region 301 and the N-type well region 302 are formed, STI structures 313 can be formed in the semiconductor substrate. The STI structures 313 can be used for isolating adjacent doped regions.

When the impurity ions doped in the first center-doped region 305 are N-type, the first center-doped region 305, the first N-type doped region 311, and the second N-type doped region 306 can be formed by the same ion implantation process. Such an ion implantation process can be referred to as an N-type ion implantation process, or a same N-type ion implantation process.

When the impurity ions doped in the first center-doped region 305 are P-type, the first center-doped region 305, the first P-type doped region 307, and the second P-type doped region 309 can be formed by the same ion implantation process. Such an ion implantation process can be referred to as a P-type ion implantation process, or a same P-type ion implantation process.

Therefore, the sequence of Steps S102-S107 as shown in FIG. 6 is illustrative only. Depending on the doping type of the second center-doped region 304 and the first center-doped region 305 region and other requirements of the actual fabrication process, Steps S102-S107 can be performed in any appropriate sequence according to actual needs of fabrication process, without limitation.

In another embodiment, the concentration of the impurity ions in the second center-doped region 304 can be gradually increased from the lower surface of the second center-doped region 304 to the upper surface of the second center-doped region 304, in the direction from the bottom of the semiconductor substrate 300 to the surface of the semiconductor substrate 300. The second center-doped region 304 can be formed by one or more ion implantation processes that have different doses and different energies. When the second center-doped region 304 is formed by multiple ion implantation processes, the multiple ion implantation processes can have doses continuously increased and energies continuously decreased.

In one example, during a process of forming the second center-doped region 304, a trench can be formed by etching the semiconductor substrate 300. Next, the second center-doped region 304 that is doped with impurity ions can be formed in the trench using an in situ doped epitaxial process. By adjusting the flow rate of the impurity source gas during the in situ doped epitaxial process, distribution of the concentration of the impurity ions in the second center-doped region 304 can be adjusted.

In certain embodiments, an SCR ESD protection device is provided. The device is shown in FIG. 5. The device can include both of a first center-doped region 305 and a second center-doped region 304 that extend across a P-type well region 301 and an N-type well region 302.

Further, as shown in FIG. 4, a first N-type doped region 311 can have a plurality of discrete third P-type doped regions 312 therein. The plurality of third P-type doped regions 312 can divide the first N-type doped region 311 into a plurality of first N-type sub-doped regions. The plurality of first N-type sub-doped regions can have an equal area. Similarly, the second P-type doped region 309 can have a plurality of discrete third N-type doped regions 310 therein. The plurality of third N-type doped regions 310 can divide the second P-type doped region 309 into a plurality of second P-type sub-doped regions. The plurality of second P-type sub-doped regions can have an equal area. Thus, the area of the emitter of the parasitic NPN transistor and/or the parasitic PNP transistor can be reduced. Emitter efficiency can be reduced, so the trigger voltage and the holding voltage of the SCR ESD protection device can be adjusted.

For example, the area of the first N-type doped region 311 in the P-type well region 301 can thus be reduced. Emitter efficiency can be reduced. The current gain of the parasitic NPN transistor can be reduced. Accordingly, the holding voltage of the SCR ESD protection device can be increased.

The SCR ESD protection device can be triggered via a breakdown of a PN junction that generates a breakdown current. The PN junction can be a junction formed by the P-type well region 301 and the second center-doped region 304 (when the second center-doped region 304 is N-typed doped), or the N-type well region 302 and the second center-doped region 304 (when the second center-doped region 304 is P-typed doped). When the breakdown occurs, the breakdown current can be concentrated at a location where the parasitic resistance is relatively low, i.e., the first center-doped region 305 at the surface of the semiconductor substrate 300. The voltage drop caused by the breakdown current can turn on the parasitic NPN transistor (when the second center-doped region 304 is N-typed doped), or the parasitic PNP transistor (when the second center-doped region 304 is P-typed doped). After the parasitic NPN (or PNP) transistor is turned on, the parasitic PNP (or NPN) transistor can be turned on. After being turned on, the parasitic NPN transistor and the parasitic PNP transistor can enter a linear operation region or a linear amplification region. From the operating principles of a transistor, it is known that, at that time, the current can choose to flow via a path having a relatively low doping concentration in the base region (i.e., the N-type well region 302 and the P-type well region 301). With the increasing of the current, due to the influence of a high injection effect, the current gain of the parasitic NPN transistor and the parasitic PNP transistor can be reduced. For example, when the second center-doped region 304 and the first center-doped region 305 are N-type doped, the current can start to move toward the N-type base region of the parasitic PNP transistor (i.e., the second center-doped region 304 and the first center-doped region 305), which has a relatively high doping concentration. At this time, the second center-doped region 304 and the first center-doped region 305 base region can also be involved in discharging or releasing the current.

Therefore, using the SCR ESD protection device according to various disclosed embodiments, when an electrostatic current is released, the electrostatic current can have a more uniform distribution. With the increase of the doping concentration of the base region, and with the increase of paths for releasing the electrostatic current when the electrostatic current flow through the low-concentration region at the bottom of the N-type well region 302 and the P-type well region 301, the current gain of the parasitic NPN transistor and the parasitic PNP transistor can be reduced. Accordingly, the holding voltage during electrostatic discharge can be increased, and latch-up effect can be effectively prevented.

Figure 7:
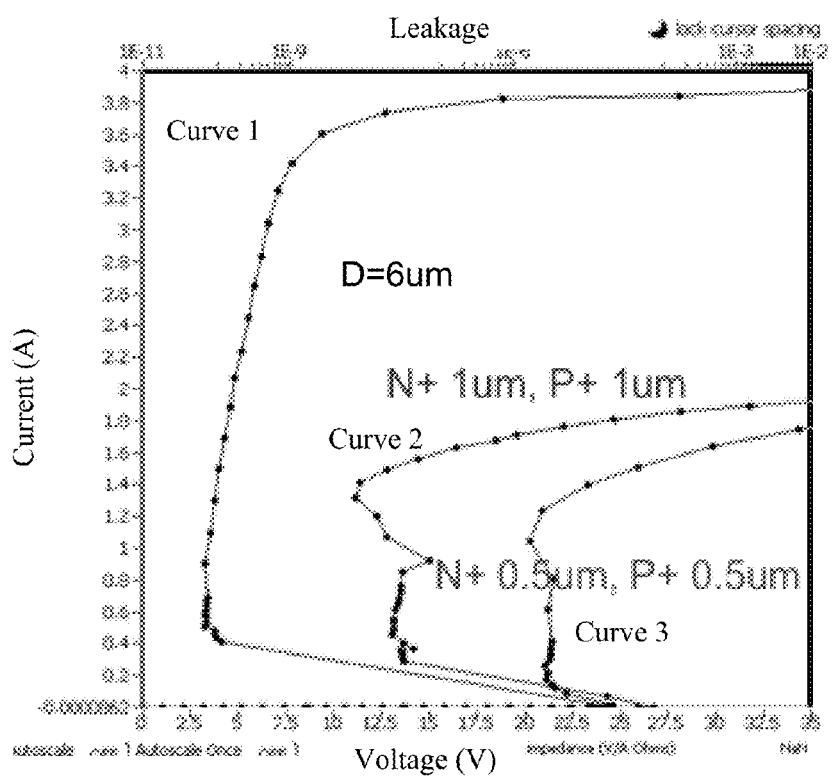
FIG. 7 depicts an electrical discharge current of different SCR ESD protection devices as a function of voltage in accordance with various disclosed embodiments.

FIG. 7 depicts an electrical discharge current of different SCR ESD protection devices as a function of voltage in accordance with various disclosed embodiments. In this case, the voltage can refer to a voltage applied between the anode and the cathode of an SCR ESD protection device. The SCR ESD protection devices can be the same as or similar to the devices as shown in FIGS. 4-5. The width D1 of the first center-doped region 305 can be about 6 microns. The Curve 1 depicts an SCR ESD protection device where the first N-type doped region 311 is not divided by a plurality of discrete third P-type doped regions 312, and the second P-type doped region 309 is not divided by a plurality of discrete third N-type doped regions 310. Curve 2 depicts an SCR ESD protection device where the first N-type doped region 311 is divided by a plurality of discrete third P-type doped regions 312, and the second P-type doped region 309 is divided by a plurality of discrete third N-type doped regions 310, and D2 is about 1 micron. Curve 3 depicts an SCR ESD protection device where the first N-type doped region 311 is divided by a plurality of discrete third P-type doped regions 312, and the second P-type doped region 309 is divided by a plurality of discrete third N-type doped regions 310, and D2 is about 0.5 micron.

In the example as shown in FIG. 7, the impurity ions doped in the first center-doped region 305 and the second center-doped region 304 can be N-type. As shown by the Curves 1-3 in FIG. 7, by adding the second center-doped region 304, the trigger voltage can be reduced to about 24 V. In addition, by dividing the first N-type doped region 311 into a plurality of first N-type sub-doped regions and dividing the second P-type doped region 309 into a plurality of second P-type sub-doped regions, the holding voltage can be increased. The device represented by Curve 2 has a holding voltage increased to about 12 V. The device represented by Curve 3 has a smaller D2, i.e., a smaller emitter area, and the holding voltage is increased to about 20 V.

Figure 8:
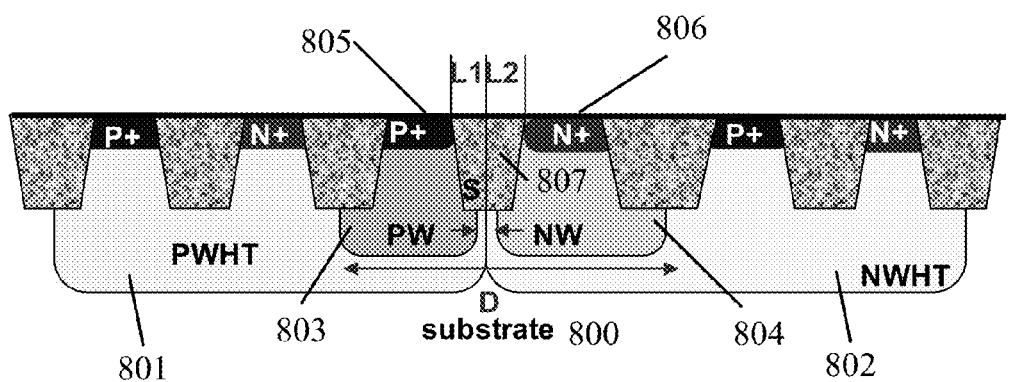
FIG. 8 depicts a cross-sectional view of another exemplary SCR ESD protection device in accordance with various disclosed embodiments.

FIG. 8 depicts a cross-sectional view of another exemplary SCR ESD protection device in accordance with various disclosed embodiments. Compared with the device depicted in other embodiments (e.g., as shown in FIG. 5) that has the second center-doped region 304 and the first center-doped region 305 extending across the N-type well region 302 and the P-type well region 301, the device as shown in FIG. 8 has an implanted P-type well (PW) 803 in a P-type well region 801 and an implanted N-type well (NW) 804 in an N-type well region 802. The implanted P-type well (PW) 803 and the implanted N-type well (NW) 804 can each have a relatively high doping concentration of impurity ions.

Still referring to FIG. 8, a heavily-doped implanted P+ region 805 can be formed in the implanted P-type well (PW) 803 and at the surface of the semiconductor substrate 800. A heavily-doped implanted N+ region 806 can be formed in the implanted N-type well (NW) 804 and at the surface of the semiconductor substrate 800. An STI structure 807 can be formed between the implanted P-type well (PW) 803 and an implanted N-type well (NW) 804. The implanted P-type well (PW) 803 and the heavily-doped implanted P+ region 805 can be isolated from the implanted N-type well (NW) 804 and the heavily-doped implanted N+ region 806 by the STI structure 807 and a portion of the P-type well region 801 and the N-type well region 802, where the portion can have a width S, as shown in FIG. 8. The width of the STI structure 807 in the implanted P-type well (PW) 803 and in the implanted N-type well (NW) 804 can be L1 and L2, respectively. Thus, the total width of the STI structure 807 between the implanted P-type well (PW) 803 and the implanted N-type well (NW) 804 can be L1+L2. Further, the total distance that the implanted P-type well (PW) 803 and the implanted N-type well (NW) 804 extend across can be a distance D. S, D, L1 and L2 can be adjusted based on actual needs of device design and fabrication process. The device as shown in FIG. 8 can improve the performance for ESD protection via a similar mechanism as the device as shown in various other embodiments as disclosed herein, e.g., as shown in FIGS. 4-5.

As used herein, relational terms such as 'first' and 'second' are merely used for differentiate one element or operation from another element or operation, and do not require or imply that any actual relationship or order as such exist between these elements or operations. In addition, the terms "include", "comprise", "contain", or any other variations thereof, are intended to cover a non-exclusive inclusion, such that a process, method, article, or apparatus that includes a series of elements can not only include those elements, but also include other elements not expressly listed, or inherent elements for such a process, method, article, or apparatus. Without further limitation, an element defined by a statement "include one . . . " does not exclude additional identical elements that may be included in the process, method, article, or apparatus that includes the element.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A silicon-controlled rectifier (SCR) electrostatic discharge protection (ESD) device, comprising:
   a semiconductor substrate having a P-type well region and an N-type well region adjacent to the P-type well region;
   a first P-type doped region in the P-type well region;
   a first N-type doped region in the P-type well region between the first P-type doped region and the N-type well region;
   a second N-type doped region in the N-type well region;
   a second P-type doped region in the N-type well region between the second N-type doped region and the P-type well region; and
   a first center-doped region and a second center-doped region, wherein the first center-doped region and the second center-doped region are located between the first N-type doped region and the second P-type doped region and extend across the P-type well region and the N-type well region, the first center-doped region is located within and enclosed by the second center-doped region, the second center-doped region has a depth greater than a depth of the first center-doped region, and the first center-doped region and the second center-doped region are doped with impurity ions of a same type, a concentration of the impurity ions in the first center-doped region being higher than a concentration of the impurity ions in the second center-doped region.

2. The device according to claim 1, wherein:
the impurity ions doped in the first center-doped region and the second center-doped region are N-type,
the depth of the second center-doped region is smaller than a depth of the N-type well region, and
the concentration of the impurity ions in the second center-doped region is higher than a concentration of impurity ions in the N-type well region.

3. The device according to claim 2, wherein
the concentration of the impurity ions in the N-type well region is less than about 1E18 atom/cm$^3$,
the concentration of the impurity ions in the second center-doped region ranges from about 1E18 atom/cm$^3$ to about 1E19 atom/cm$^3$, and
the concentration of the impurity ions in the first center-doped region is higher than about 1E19 atom/cm$^3$.

4. The device according to claim 1, wherein:
the impurity ions doped in the first center-doped region and the second center-doped region are P-type,
the depth of the second center-doped region is smaller than a depth of the P-type well region, and
the concentration of the impurity ions in the second center-doped region is higher than a concentration of impurity ions in the P-type well region.

5. The device according to claim 4, wherein
the concentration of the impurity ions in the P-type well region is less than about 1E18 atom/cm$^3$,
the concentration of the impurity ions in the second center-doped region ranges from about 1E18 atom/cm$^3$ to about 1E19 atom/cm$^3$, and
the concentration of the impurity ions in the first center-doped region is higher than about 1E19 atom/cm$^3$.

6. The device according to claim 1, further comprising a shallow trench isolation (STI) structure between adjacent doped regions.

7. The device according to claim 1, wherein the concentration of the impurity ions in the second center-doped region is gradually increased from a lower surface of the second center-doped region to an upper surface of the second center-doped region.

8. The device according to claim 1, wherein:
the first N-type doped region contains a plurality of discrete third P-type doped regions to divide the first N-type doped region into a plurality of first N-type sub-doped regions, and
one discrete third P-type doped region is between and in contact with adjacent first N-type sub-doped regions.

9. The device according to claim 1, wherein:
the second P-type doped region contains a plurality of discrete third N-type doped regions to divide the second P-type doped region into a plurality of second P-type sub-doped regions, and
one discrete third N-type doped region is between and in contact with adjacent second P-type sub-doped regions.

10. The device according to claim 1, wherein the first center-doped region and the second center-doped region are co-centered.

11. The device according to claim 1, wherein the first N-type doped region, the P-type well region, and the second center-doped region form a parasitic NPN transistor.

12. A method for forming an SCR ESD device, comprising:
providing a semiconductor substrate;
forming, in the semiconductor substrate, a P-type well region and an N-type well region adjacent to the P-type well region;
forming a second center-doped region that extends across the P-type well region and the N-type well region;
forming a first center-doped region in and enclosed by the second center-doped region, a depth of the second center-doped region being greater than a depth of the first center-doped region, wherein the first center-doped region and the second center-doped region are doped with impurity ions of a same type, a concentration of the impurity ions in the first center-doped region being higher than a concentration of the impurity ions in the second center-doped region;
forming a first P-type doped region in the P-type well region at a first side of the second center-doped region;
forming a first N-type doped region in the P-type well region at the first side of the second center-doped region, the first N-type doped region being located between the first P-type doped region and the second center-doped region;
forming a second N-type doped region in the N-type well region at a second side of the second center-doped region; and
forming a second P-type doped region in the N-type well region at the second side of the second center-doped region, the second P-type doped region being located between the second N-type doped region and the second center-doped region.

13. The method according to claim 12, wherein:
the impurity ions doped in the first center-doped region and the second center-doped region are N-type,
the depth of the second center-doped region is smaller than a depth of the N-type well region, and
the concentration of the impurity ions in the second center-doped region is higher than a concentration of impurity ions in the N-type well region.

14. The method according to claim 13, wherein
the concentration of the impurity ions in the N-type well region is less than about 1E18 atom/cm$^3$,
the concentration of the impurity ions in the second center-doped region ranges from about 1E18 atom/cm$^3$ to about 1E19 atom/cm$^3$, and
the concentration of the impurity ions in the first center-doped region is higher than about 1E19 atom/cm$^3$.

15. The method according to claim 12, wherein:
the impurity ions doped in the first center-doped region and the second center-doped region are P-type,
the depth of the second center-doped region is smaller than a depth of the P-type well region, and
the concentration of the impurity ions in the second center-doped region is higher than a concentration of impurity ions in the P-type well region.

16. The method according to claim 15, wherein
the concentration of the impurity ions in the P-type well region is less than about 1E18 atom/cm$^3$,
the concentration of the impurity ions in the second center-doped region ranges from about 1E18 atom/cm$^3$ to about 1E19 atom/cm$^3$, and
the concentration of the impurity ions in the first center-doped region is higher than about 1E19 atom/cm$^3$.

17. The method according to claim 12, further comprising:
forming an STI structure between adjacent doped regions.

18. The method according to claim 12, wherein:
when the impurity ions doped in the first center-doped region are N-type, the first center-doped region, the first N-type doped region, and the second N-type doped region are formed by a same N-type ion implantation process; and when the impurity ions doped in the first center-doped region are P-type, the first center-doped region, the first P-type doped region, and the second P-type doped region are formed by a same P-type ion implantation process.

19. The method according to claim 12, wherein the first center-doped region and the second center-doped region are co-centered.

20. The method according to claim 12, wherein the first N-type doped region, the P-type well region, and the second center-doped region form a parasitic NPN transistor.

* * * * *